United States Patent [19]

Linker et al.

[11] Patent Number: 4,624,160
[45] Date of Patent: Nov. 25, 1986

[54] METHOD AND APPARATUS FOR TRIMMING THE LEADS OF ELECTRONIC COMPONENTS

[75] Inventors: Frank V. Linker; Frank V. Linker, Jr., both of Broomall, Pa.

[73] Assignee: American Tech Manufacturing, Inc., Glenolden, Pa.

[21] Appl. No.: 760,045

[22] Filed: Jul. 29, 1985

Related U.S. Application Data

[62] Division of Ser. No. 547,732, Oct. 31, 1983, Pat. No. 4,539,878.

[51] Int. Cl.[4] ................. B23D 33/02; B23D 15/04
[52] U.S. Cl. ........................... 83/13; 83/99; 83/167; 83/409.2; 83/580; 83/925 R; 29/566.3; 140/139
[58] Field of Search ............... 83/99, 13, 167, 409.2, 83/580, 925 R; 29/566.3; 140/139

[56] References Cited

U.S. PATENT DOCUMENTS

| | | | |
|---|---|---|---|
| 3,307,442 | 3/1967 | Inhoff | 83/580 |
| 3,799,017 | 3/1974 | Halligan | 83/580 X |
| 4,187,751 | 2/1980 | Barnacle | 83/458 |
| 4,399,610 | 8/1983 | Moyer | 29/566.3 |

Primary Examiner—Donald R. Schran
Attorney, Agent, or Firm—Eugene E. Renz, Jr.

[57] ABSTRACT

Apparatus and method for automatically or manually controlling the apparatus for trimming or cutting leads of electric devices of the type having an elongated body portion, and a plurality of leads extending from the opposite side edges of the body portion, more specifically for trimming leads of dual-in-line-devices (DIP devices) of a type used in conjunction with printed circuit boards (PCBs), wherein component dimensions and materials vary, and adjustments are provided to accomodate for different width and length sizes and more particularly to permit trimming of lead lengths to appropriate length for coaction with various PCBs. The apparatus of the invention is adjustable for compensating for entry gate assembly, support track or guideway for automatically moving the DIPs into and from different stations, from entry to discharge, for lead trim lengths and shear width capable of trimming different width leads quickly, accurately and reliably and the trim mechanism is functional absent bending or bowing of the leads in the cutting action.

5 Claims, 24 Drawing Figures

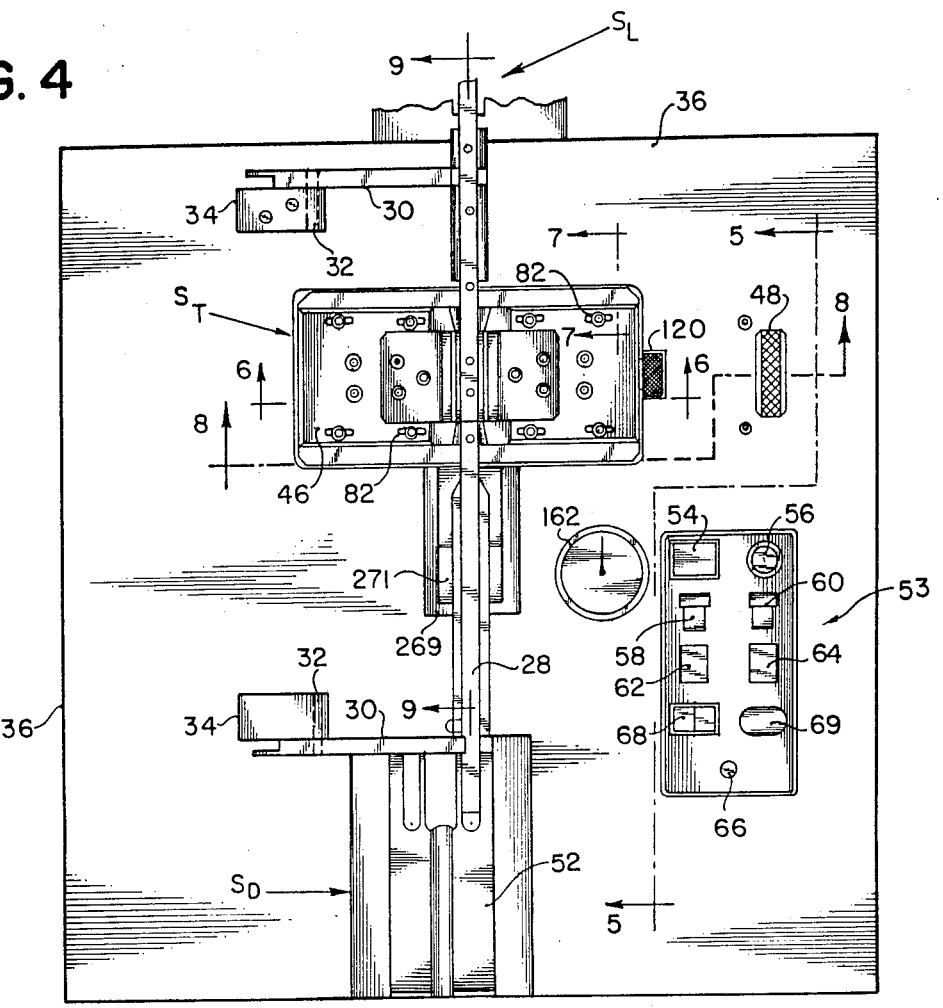
FIG. 4
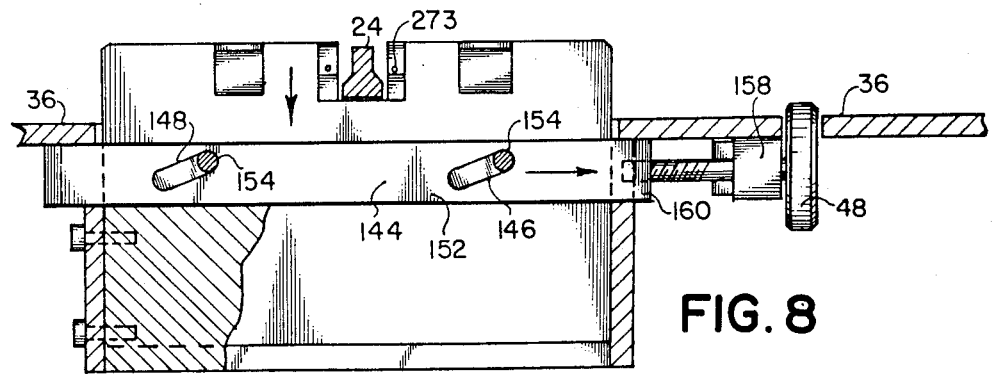
FIG. 1A  FIG. 1B  FIG. 1C  FIG. 1D
FIG. 8

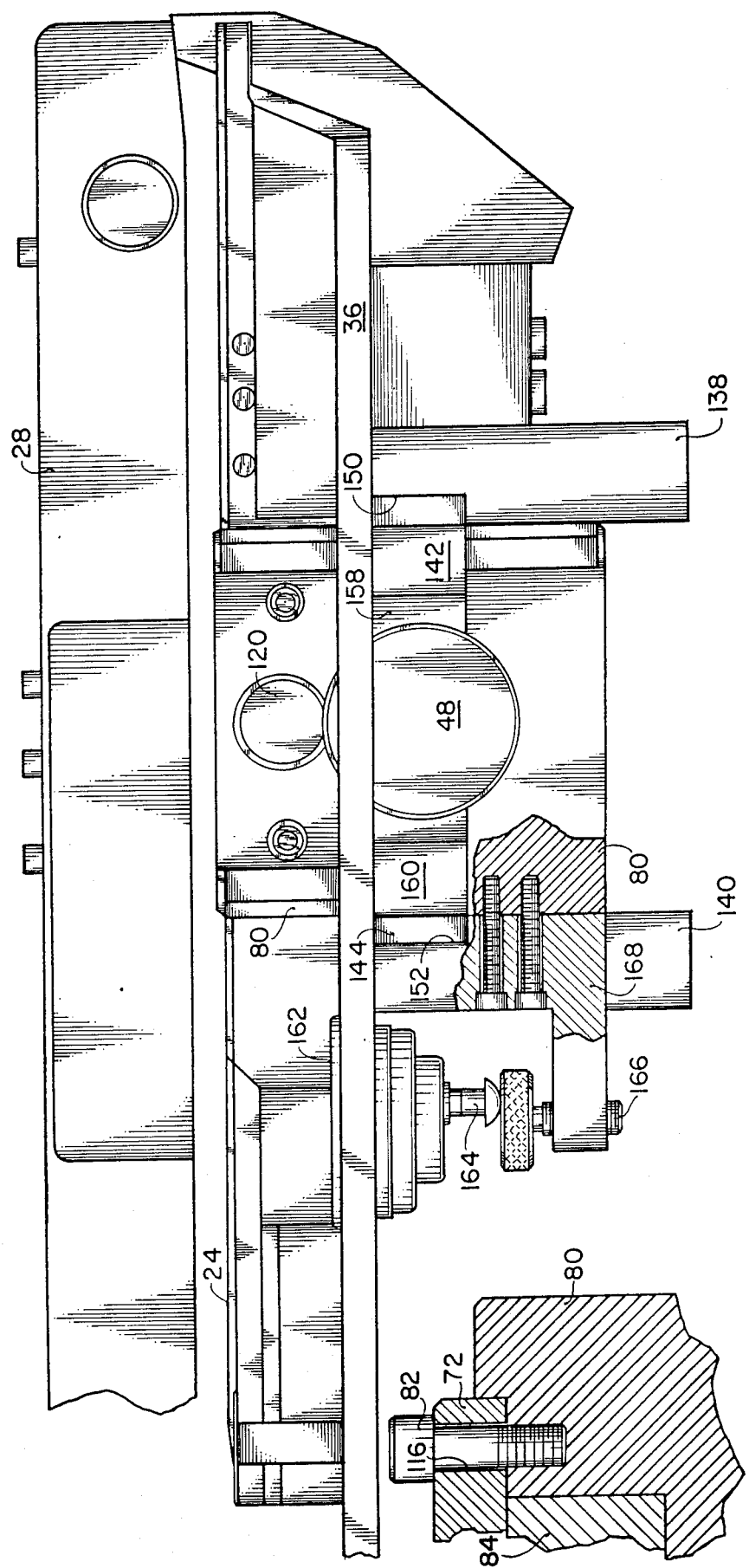

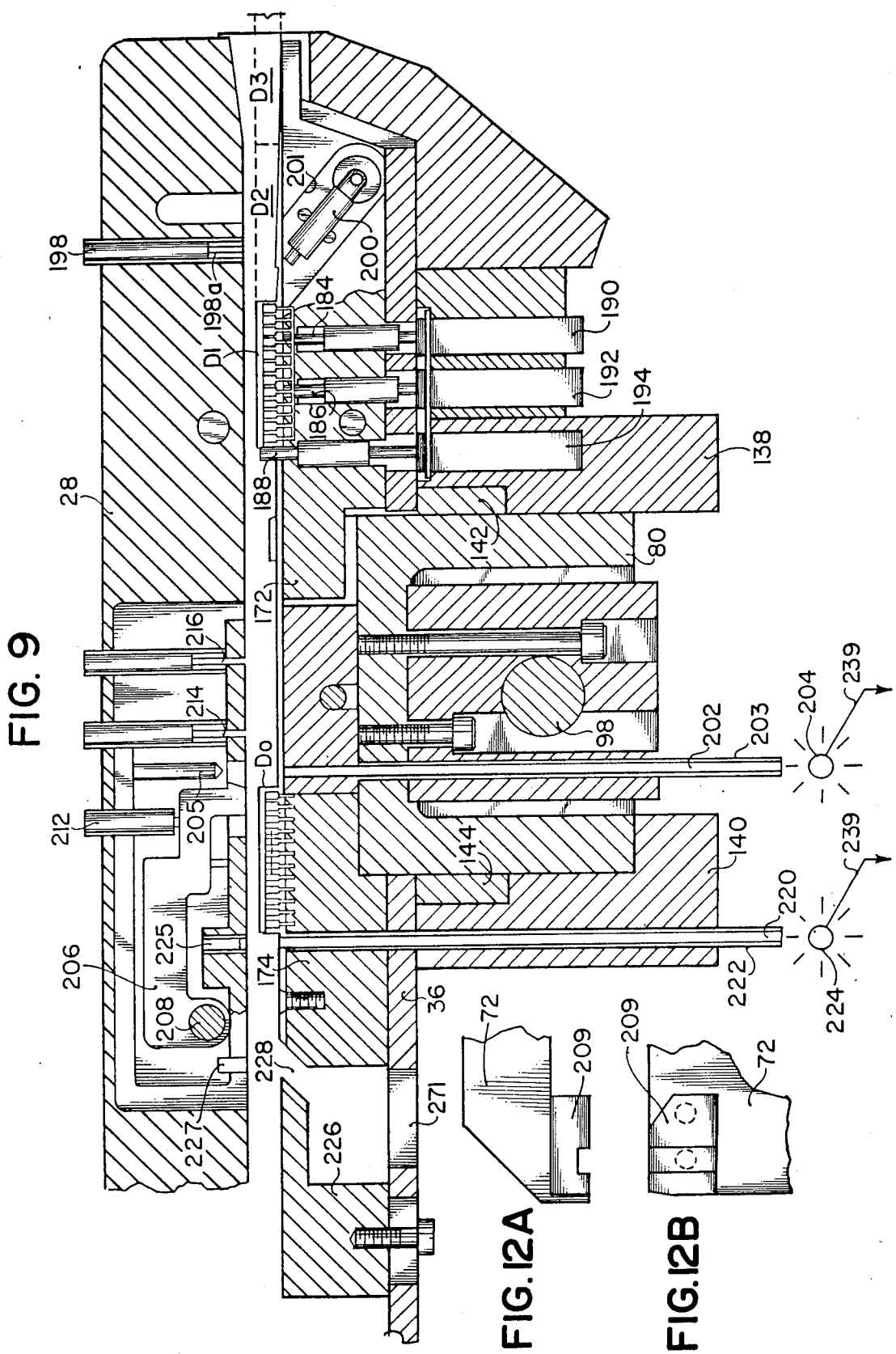

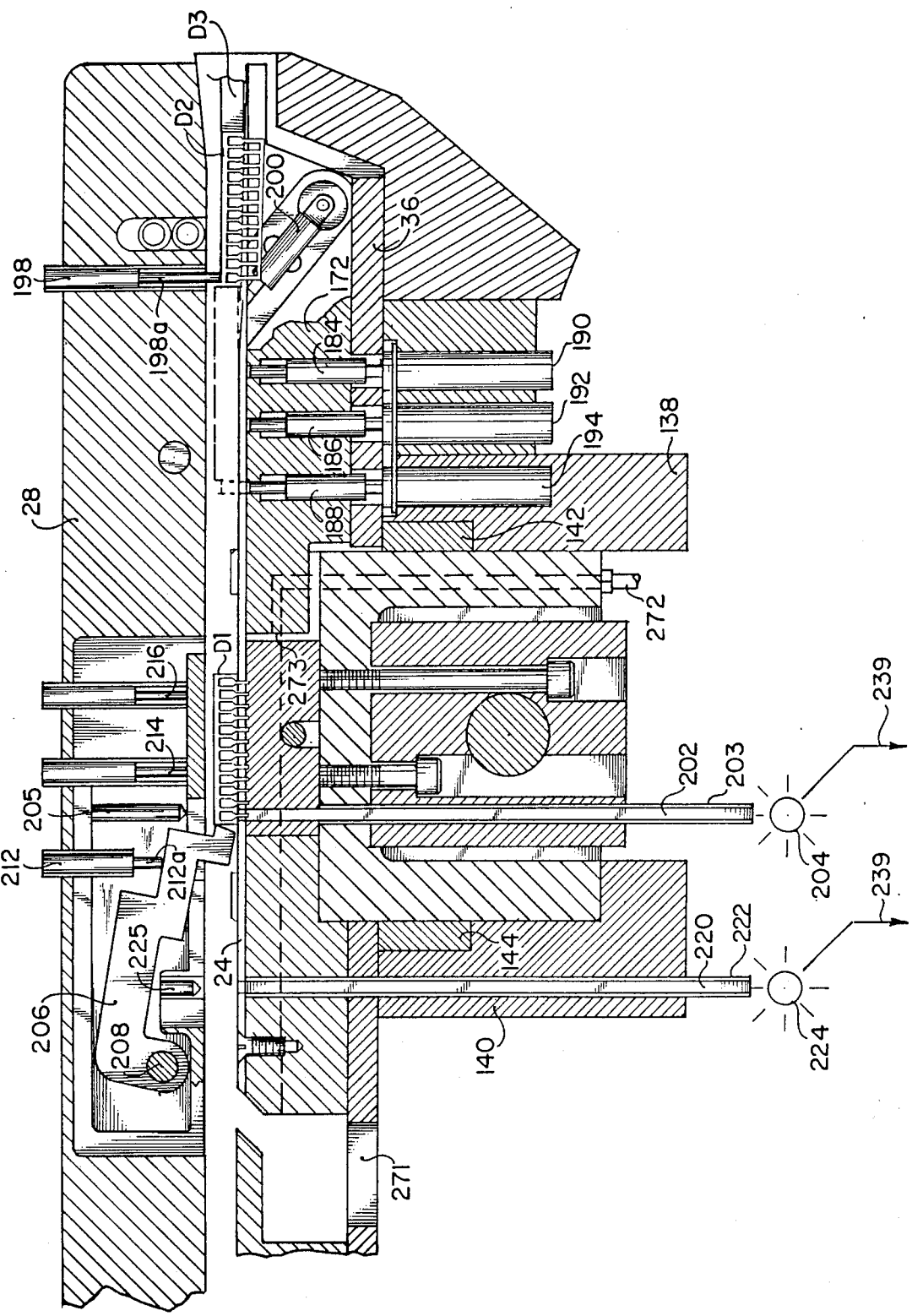

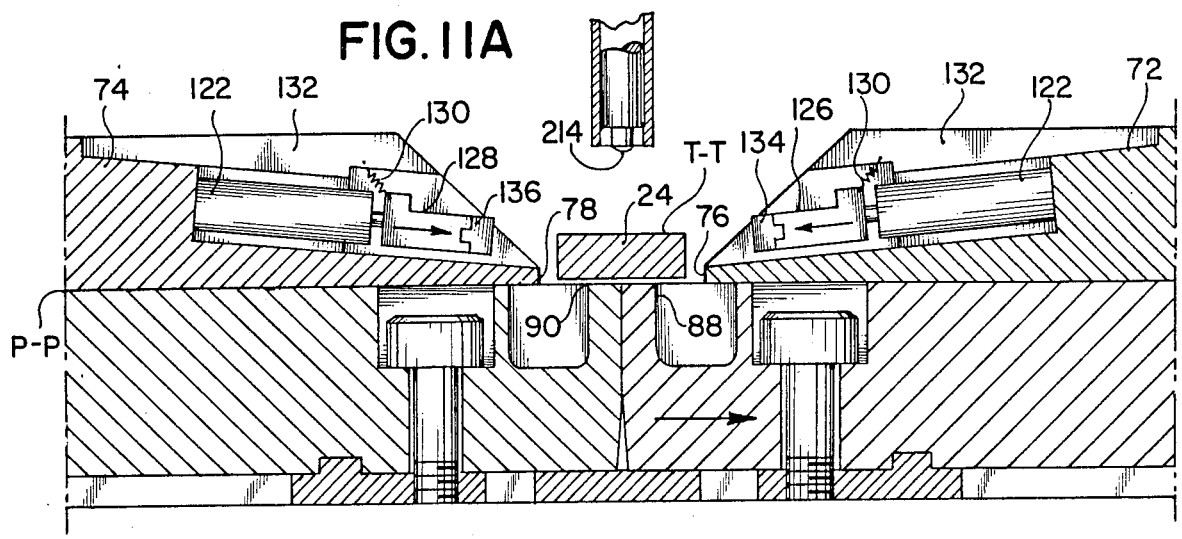
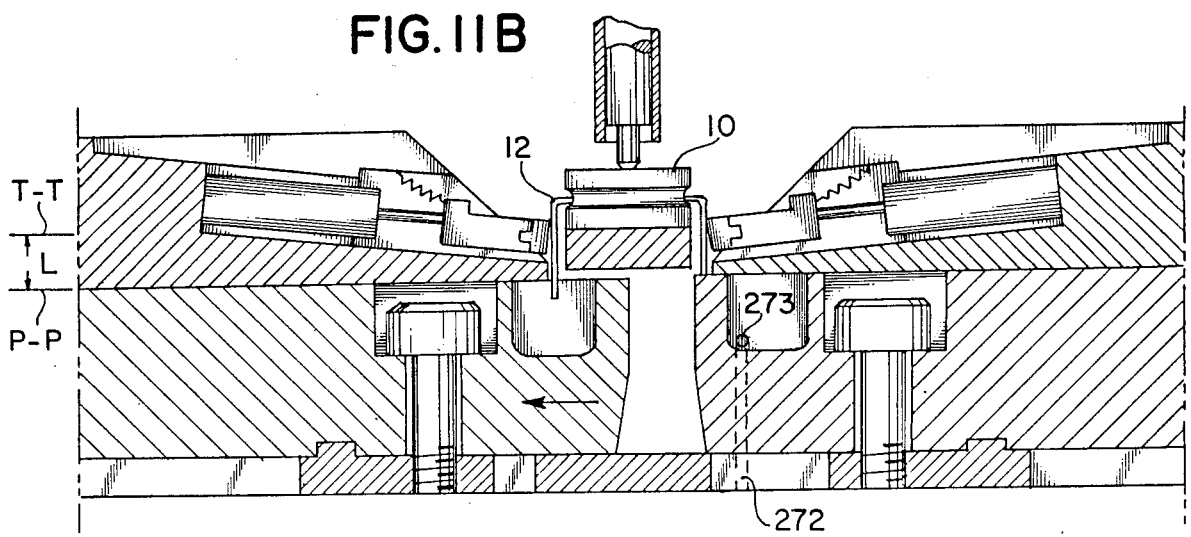
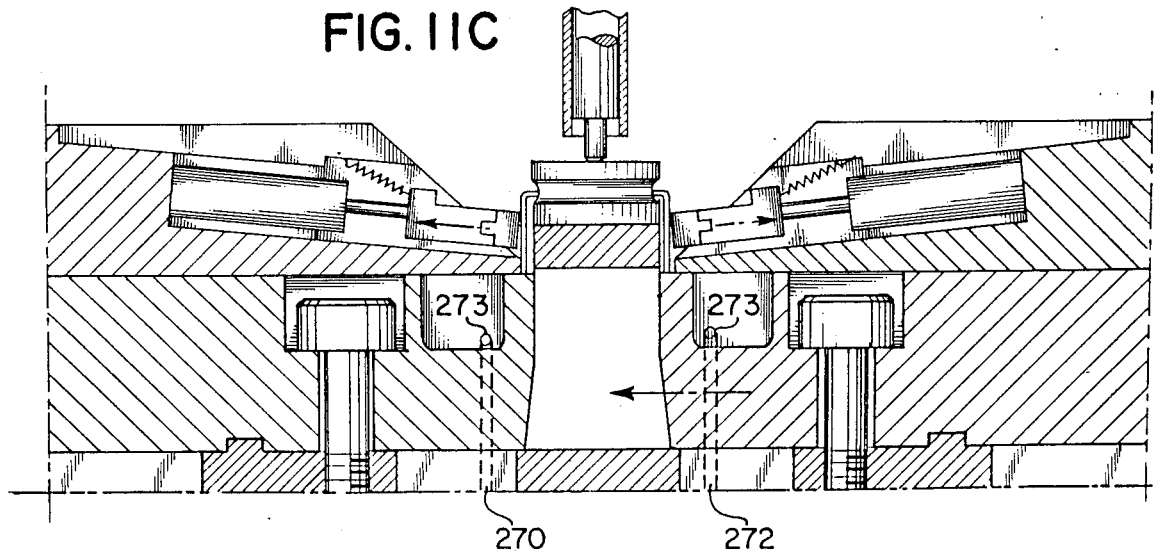

METHOD AND APPARATUS FOR TRIMMING THE LEADS OF ELECTRONIC COMPONENTS

This is a divisional of application Ser. No. 547,732 filed Oct. 31, 1983, now U.S. Pat. No. 4,539,872.

FIELD OF THE INVENTION

The present invention broadly relates to a new and improved method, and apparatus, for trimming or cutting the leads of electronic components.

More specifically the invention is directed to a novel method and apparatus for trimming and retrimming leads of so-called dual-in-line-package (DIP) devices used in electronic components such as integrated circuits, RAMs ROMs, etc. suitable for assembly on printed circuit boards (PCBs). These DIP devices are typically comprised of an elongated generally rectangular body portion made of moldable material and having embedded therein a plurality of leads arranged in rows depending from opposite side edges of the body portion and disposed at a predetermined angular relation thereto, usually perpendicular. Some DIP devices are manufactured with a protective harness to maintain the leads in straight parallel relation comprising a tie bar connected to the outer terminal ends of the leads and an inverted U-shaped bridge at opposite ends of the body portion connecting the tie bars on each side. The harness is removed when the leads are trimmed or cut to a predetermined length for a given PCB application in automated trimming and cutting apparatus. It has been found that PCB requirements are such that the nominal size of the circuit board or receiving socket incorporated in particular applications mandates a shorter lead length. It has further been found that the leads of trimmed DIP devices may bend or deform in handling and necessitate straightening in lead straightening apparatus which may elongate some of the leads. Retrimming may thus be required for PCB applications and for lead length uniformity.

DESCRIPTION OF THE PRIOR ART

Prior apparatus for trimming DIP devices typically comprised an elongated angularly disposed trackway having a DIP loading station at its upper end and a discharge station at the lower ends. The DIP devices which are usually packaged in elongated cartridges are gravity fed from the loading station along the trackway to a trimming station for trimming the leads to a desired predetermined length.

The trimmer device of these prior assemblies usually consisted of a pair of cutting blades having cutting edges disposed generally parallel to the center line of the trackway which were mounted for reciprocating movement between a retracted position outboard of the rows of leads on either side of the DIP device and an inner position inboard of the rows of leads to shear the same. The cutting blades trimmed the leads against a special track section at the trimming station generally of T-shaped cross section, the lower face of the T-portion of the track forming the anvil for the cutting blades. In order to vary the cutting length of the leads, it was necessary in these apparatus to replace the special track section. This, of course, is time consuming. Further, it has been found difficult to maintain precise alignment and the requisite small clearance between the cutting edges of the movable cutting blades and the anvil portion of the replaceable trackway to produce a sharp cutting action of the leads. Further, since the cutting blades are cycled between extended and retracted positions simultaneously to cut the leads on both sides at the same time, comparatively large trimmer blade actuating forces are required. It has also been found that when the cutting blades are cycled to trim the leads, some of the leads tend to engage or drag on and over the upper face of the cutting blade, resulting in the leads becoming outwardly bowed. This bowing or bending of the leads necessitates a straightening operation to reposition the leads in a correct alignment for proper coactive insertion into a PCB or the like. Furthermore, in these prior systems, the trackway, including the anvil at the cutting station, necessitated changing to accomodate different DIP sizes or to vary the length of the leads being trimmed. Difficulties were also encountered in proper support of the DIPs, and maintaining accurate alignment thereof with the support and trimming means to obtain optimum results.

SUMMARY OF THE INVENTION

The present invention provides method and apparatus for trimming DIP devices which is characterized by novel features of construction and arrangement which eliminates some of the problems of prior devices discussed above. The principal feature of the present invention resides in the trimmer assembly which essentially comprises a trimmer housing having a slideway formed therein extending generally transversely to a track for a pair of cutting blades which have cutting edges disposed at a slight taper to the center line of the track and a pair of adjustable shear plates with which the cutting blades cooperate having cutting edges which are generally parallel to the center line of the trackway. The cutting blades are actuatable from an inner retracted position disposed between and under the opposing rows of the DIP device disposed on the track to an extended position outwardly from the center line of the track during the cutting action. Thus, the leads are trimmed from their inner face and by reason of the tapered configuration of the cutting blades are trimmed successively or sequentially.

Additionally the present invention provides a novel actuating arrangement for the cutting blades including a double acting cylinder so that the cycling of each blade from the retracted to the extended position is slightly staggered timewise. This reduces considerably the forces required for the trimming action and produces a sharp clean cut of the leads.

The trimmer assembly is mounted for vertical adjusting movement relative to the fixed track to provide an easy, quick and accurate means for selectively varying the trim length of the leads thus obviating the need for special track sections and the time consuming mounting and dismounting thereof whenever it is desired to adjust for lead length. Additionally, the trimmer assembly includes means for adjusting the shear plates. Since various types of DIP devices may also vary in width, this facilitates adjustment of the shear plates to define a channel only slightly greater than the width of the leads thereby minimizing bowing, bending or stressing the hermetic seal where the leads are attached to the body of the device during the shearing or cutting action.

The apparatus does not require changes of trackway components for different lengths of DIPs, nor different lead trimming lengths. Adjustment of the components permits accomodating variations.

The DIP leads are trimmed quickly, accurately and cleanly. The DIP is supported in the trimming station to insure cutting efficiency, including DIP hold-down cylinders and lead support members which hold the DIP snugly on the track and insure accurate, parallel cuts. Lead length is determined and uniformity of the parallel cut ensured by moving the cutting assembly as a unit toward or away from the fixed track.

The cutter blades or movable cutter slides, per se, are moved only in a single operating direction, from a position between the leads to be trimmed, outwardly, for cutting in conjunction with fixed shear plates. The trimmed scraps fall into cavities and preferably are removed by gravity and an air blast assist to a disposal container.

Since the hold-down cylinders and lead support members release the DIP device simultaneous with the return of the cutter blades to their original position, the trimmed leads do not ride on the surface of the cutter blade following cutting and therefore there is no tendency to bow or bend the trimmed leads by a frictional dragging action through lead end contact with a movable cutter blade.

The convergent taper of the blade cutting edges cooperate with the opposing parallel straight-sided edges of the shear plates to effect progressive or sequential trimming or cutting of the leads which yields lower cutting forces and minimizes the likelihood of disturbing the hermetic seal between the body portion and leads.

The apparatus of the present invention incorporates indicator means for adjustment verification of the adjustable components, such as a trim length indicator which provides accurate reading of programmed cutting length. Trim length fine adjustment permits leads to be trimmed and retrimmed with extreme accuracy and lead lengths can be changed while the machine is in operation.

With the foregoing in mind, it is broadly an object of the present invention to provide a new and improved method and apparatus for automatic trimming of electronic components, particularly DIP devices of the type described above.

Another object of the present invention is to provide a method and apparatus for trimming DIP devices which incorporates a fixed trackway wherein the lead trimming assembly may be easily and quickly adjusted to trim the leads at the preselected lengths thereby to minimize the adjustments necessary to change the lead length and eliminate adjustments and assembly errors between critical trimming elements.

Another object of the present invention is to provide a method and apparatus for the trimming of electronic components which provides accurate, sharp parallel cuts to component leads, particularly the leads of DIP devices of the type described above.

Another object of the present invention is to provide a method and apparatus for trimming DIP devices which incorporates support members which engage and support the DIP device during the trimming operation.

Another object of the present invention is to provide a novel trimming method and apparatus wherein the leads are trimmed clearly and sharply without bowing or bending the leads.

Another object of the present invention is to provide a method and apparatus for trimming DIP devices which progressively trims the leads along the length of the DIP device thereby reducing the cutting forces required and also reducing the stresses on the hermetic seal between the ceramic body portion and leads.

Yet another object of the present invention is to provide a method and apparatus for trimming DIP devices which incorporates means for removing trimmings from the apparatus, including the harness components in a manner minimizing jamming and thereby facilitating trouble free, high speed operation.

DESCRIPTION OF THE DRAWINGS

These and other objects of the present invention and the various features and details of the operation and construction thereof are hereinafter more fully set forth with reference to the accompanying drawings, wherein:

FIG. 1 is a side elevation of various types of DIP devices;

FIG. 4 is a plan view along the line 4—4 of FIG. 3;

FIG. 5 is a section view along the line 5—5 of FIG. 4;

FIG. 7 is a section view along the line 7—7 of FIG. 4;

FIG. 8 is a section view along the line 8—8 of FIG. 4;

FIG. 9 is a section view along the line 9—9 of FIG. 4;

FIG. 10 is an identical section view of FIG. 9, except the DIP device has been stopped in the trimming station;

FIGS. 11A–11C are a series of section views depicting a trimming sequence;

FIGS. 12A, 12B are a partial section view of a shear plate depicting the attachment of a further shear plate for vertical cutting operation;

DESCRIPTION OF THE PREFERRED EMBODIMENTS

Figure 3:
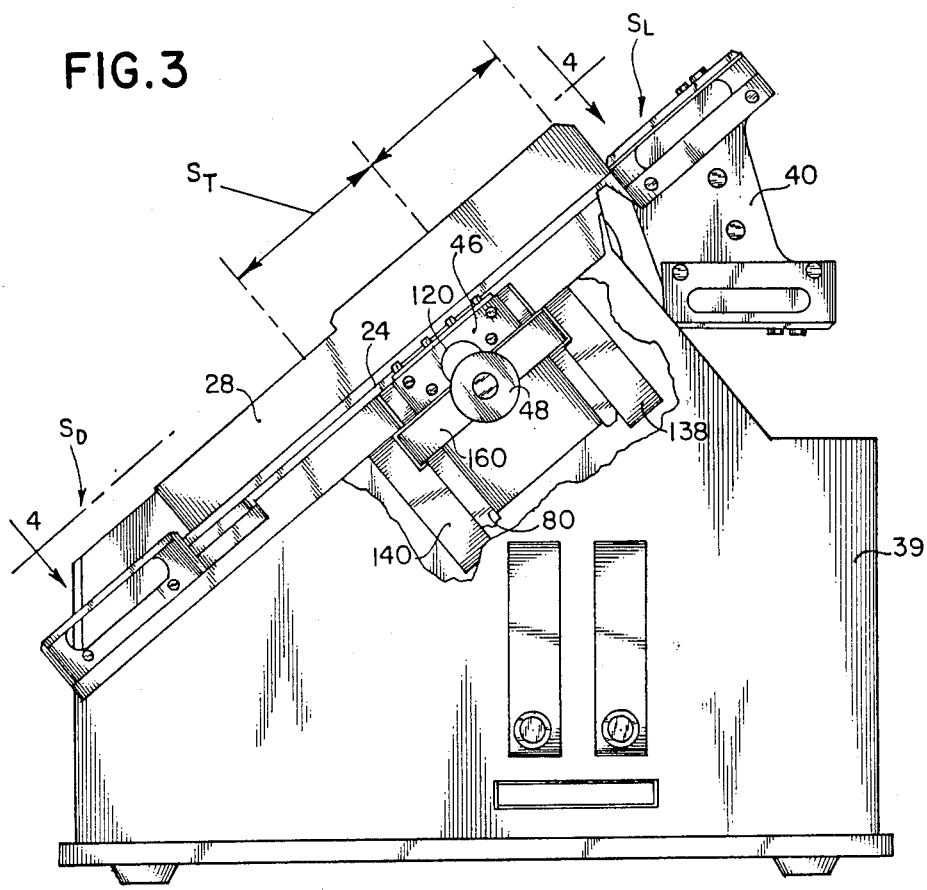
FIG. 3 is a side elevation of the present invention.
Figure 2:
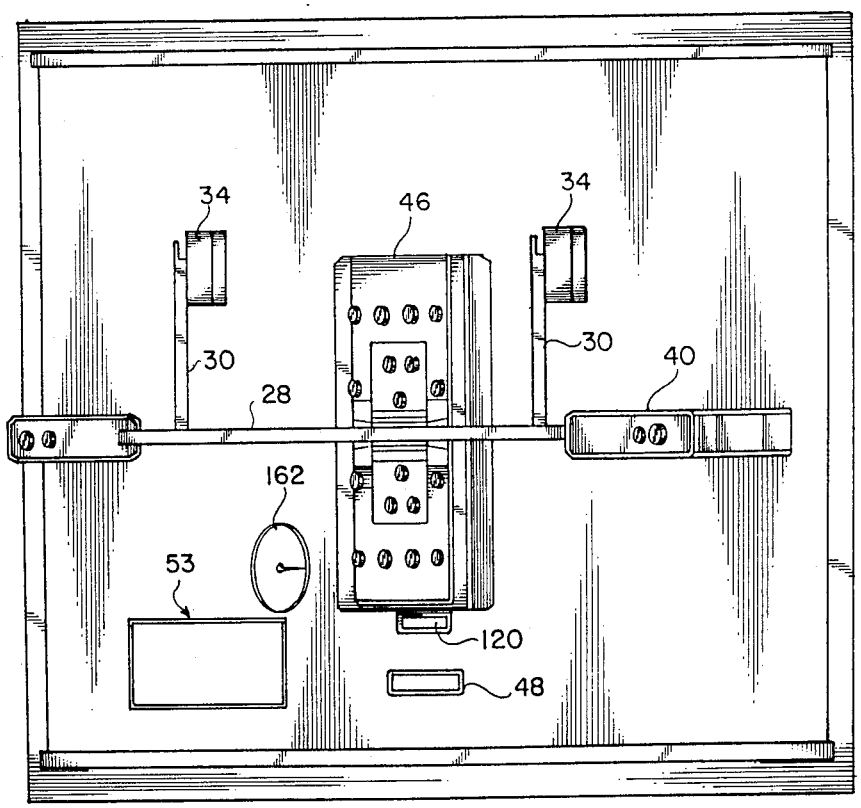
FIG. 2 is a plan view of the present invention.

The system and apparatus of the present invention are adapted for trimming and retrimming leads of various types of DIP devices. FIGS. 1A–1D inclusive show a variety of typical DIP devices. These devices as illustrated generally comprise an elongated generally rectangular body portion 10, made of a moldable material such as ceramic or plastic, and having embedded therein a plurality of leads or pins 12, which normally are uniformly parallel spaced and in straight rows generally perpendicular to body portion 10. Some of these devices, as manufactured, may include a protective harness such as tie bar 14, which joins the terminal ends of all leads and may include an inverted "U" shaped bridge members 16 which connect the tie bars on opposite sides of the DIP to provide support and ease of handling. Further, DIP devices may be manufactured in groups, wherein tie bar 14 includes an attachment strip 18, interconnecting adjacent DIP devices. The connecting members 14, 16 and 18 are trimmed prior to operative mounting in a circuit or IC board.

The method of the invention will be presented hereinafter in conjunction with the description of apparatus for trimming DIP devices. A general understanding of the basic structure and operation of the apparatus may be gained by several of the views which best show the basic components of the apparatus and operation thereof such as FIGS. 2–4 and 11. Considering first the basic components of the trimmer apparatus in terms of interrelated functions, the apparatus as best illustrated in FIG. 3 includes an elongated fixed trackway 24 having a loading station at its upper end, a discharge station $S_D$ at its lower end and a trimmer station $S_T$ therebetween. A cartridge C for DIP devices housed therein in abutting end-to-end relation is adapted to be positioned at the loading station $S_L$ so that the DIP devices are gravity fed down the trackway 24 through the various stations described above. These DIP devices are presented to loading station $S_L$ by positioning an open end of cartridge C into a rotatable turret-like mechanism 40. Mechanism 40 is turned to align the open end of the cartridge with track 24 so that DIP devices flow freely from the cartridge or tube onto track 24 to a singulator system $S_S$. Position control means in the form of detent or hold-down mechanisms are provided in the singulator system $S_S$ and trimming stations $S_T$ which operate in a predetermined controlled timed sequence to control movement of the DIP devices through the trimmer apparatus. The control system as described in more detail hereafter also includes means for sensing various positions of the DIP devices on the trackway 24 to control operation of the stop and detent mechanisms to effect automatic continuous cycling of the operative elements of the trimmer apparatus facilitating high speed processing of the DIP devices.

Tracing now briefly a typical cycle of operation, DIP devices initially encounter the singulator system $S_S$ wherein the hold-down and detent means function to release DIP devices one at a time to the trimming station $S_T$ so that only a single DIP device enters the trimming station $S_T$ when the trimming station is conditioned or clear to receive a device for trimming. Means including a recessed ramp portion 24a in the trackway and ejector mechanism 200 are provided to ensure separation of DIP devices which may be lodged together at the harness and thereby further ensure discharge of only a single DIP device at a time to the trimming station and eliminate the possibility of jamming should more than one DIP device enter the trimming station. DIP devices entering the trimming station are detained by a stop mechanism, a component of the singulator system, for a trimming operation by the trimmer assembly which broadly comprises a pair of reciprocating cutting blades having beveled or tapered cutting edges which cooperate with generally straight-sided edges of shear plates disposed on opposite sides and outboard of the leads of the DIP devices. The cutting blades are actuatable from a retracted position adjacent the center line of the trackway and inboard of the rows of leads of the DIP device to an extended position during the trimming cycle. Actuation of each of the cutting blades is slightly staggered to thereby produce a progressive cutting of the leads along one row followed by progressive or sequential cutting of the leads of the opposing rows. In this manner the cutting forces are considerably reduced and the danger of stressing the seal between the body portion and the leads is greatly minimized.

The entire trimmer assembly is mounted for vertical adjustment relative to the trackway and thereby provide easy, quick and precise means for varying lead length.

The apparatus includes an elongated guide rail 28 which is co-extensive with the trackway and as illustrated in FIG. 5 is spaced above the same so that the DIPs are captive between the track and guide rail during the movement through the apparatus. The space between the guide rail and the trackway is adjustable for DIPs of different sizes. The guide rail is mounted for pivoting movement on the face plate of the apparatus to a retracted position exposing the track for complete access to the trackway in the event of DIP jamming or the like.

Suitable controls including circuitry to be described in more detail hereafter are provided for effecting operation of the trimmer apparatus in the manner broadly described above. A control panel is mounted on the faceplate within easy view of the operator and includes the various automatic and manual operating controls for the electronic and pneumatic control systems. These include power-on switch 54, air indicator 56, automatic cycle switch 58, manual trim switch 60, automatic cycle stop switch 62, manual advance switch 64, manual shift track switch 66 and packaging set switch 68, all of which will be described as to operation herein.

Having broadly described the operation of trimmer apparatus 20, consider now in greater detail trimmer assembly 46 in FIGS. 5–8. To achieve the uniform and clean cut of leads 12, two shear plates 72 and 74, having confronting edges 76 and 78 against which the leads are cut, are positioned on either side of track 24. Edges 76 and 78 are oriented parallel to the center line $T_O$ of track 24 spaced therefrom defining a channel. Shear plates 72 and 74 are fixed in this position through their attachment across the top of an H-shaped housing 80 by screws 82. Loosening and re-tightening of screws 82 allows shearplates 72 and 74 to be repositioned toward or away from track 24 such that as DIP devices travel down track 24, leads pass through the channel defined by edges 76 and 78 spaced only a slight distance therefrom. Leads 12 are cut by two cutting blades 84 and 86 which underlie shear plates 72 and 74 and slide in a generally rectangular channel or chamber formed in housing 80, transversely to track 24. The cutting blades include cutting portions defining a slot 91 across the width of the cutting blade generally parallel to track 24, having opposing back faces which are positioned proximate each other beneath track 24 when the blades are in a retracted position such that DIP devices may pass freely thereover with leads 12 extending into slots 91 (FIG. 11A) To reduce the pressure on the DIP device during the cutting operation, the cutting portions additionally include cutting edges 88 and 90 oriented at an angle with respect to center line 25 of track 24. As cutting blades 84 and 86 are extended, they move outwardly and transversely from under track 24 engaging and cutting leads 12 against edges 76 and 78. The angled orientation of cutting edges 88 and 90 ensures that leads are cut progressively along the length of the DIP device, keeping the pressure exerted on body portion 10 at a minimum. If the pressure on body portion 10 were too great, as during a simultaneous cut of all leads, damage can result to the DIP device making it unuseable. As will be described in greater detail hereinafter, bending of leads 12 during trimming is avoided by the top face of cutting blades 84 and 86 not passing completely beneath shear plates 72 and 74 when the blades are extended. Additionally, cutting blades 84 and 86 and associated shearing plates extend a sufficient distance parallel to track 24 to trim DIP devices of various lengths.

Cutting blades 84 and 86 are extended and retracted by connection to brackets 92 and 94, which in turn are connected to the threaded end of piston rod 98 and the threaded end of double acting air cylinder 100 respectively. Cylinder 100 is positioned to slide axially in the bottom of housing 80 transversely to track 24, moving brackets 92 and 94 and in turn cycling the cutting blades between a retracted position (FIG. 11A) and an extended position (FIG. 11C).

Figure 6:
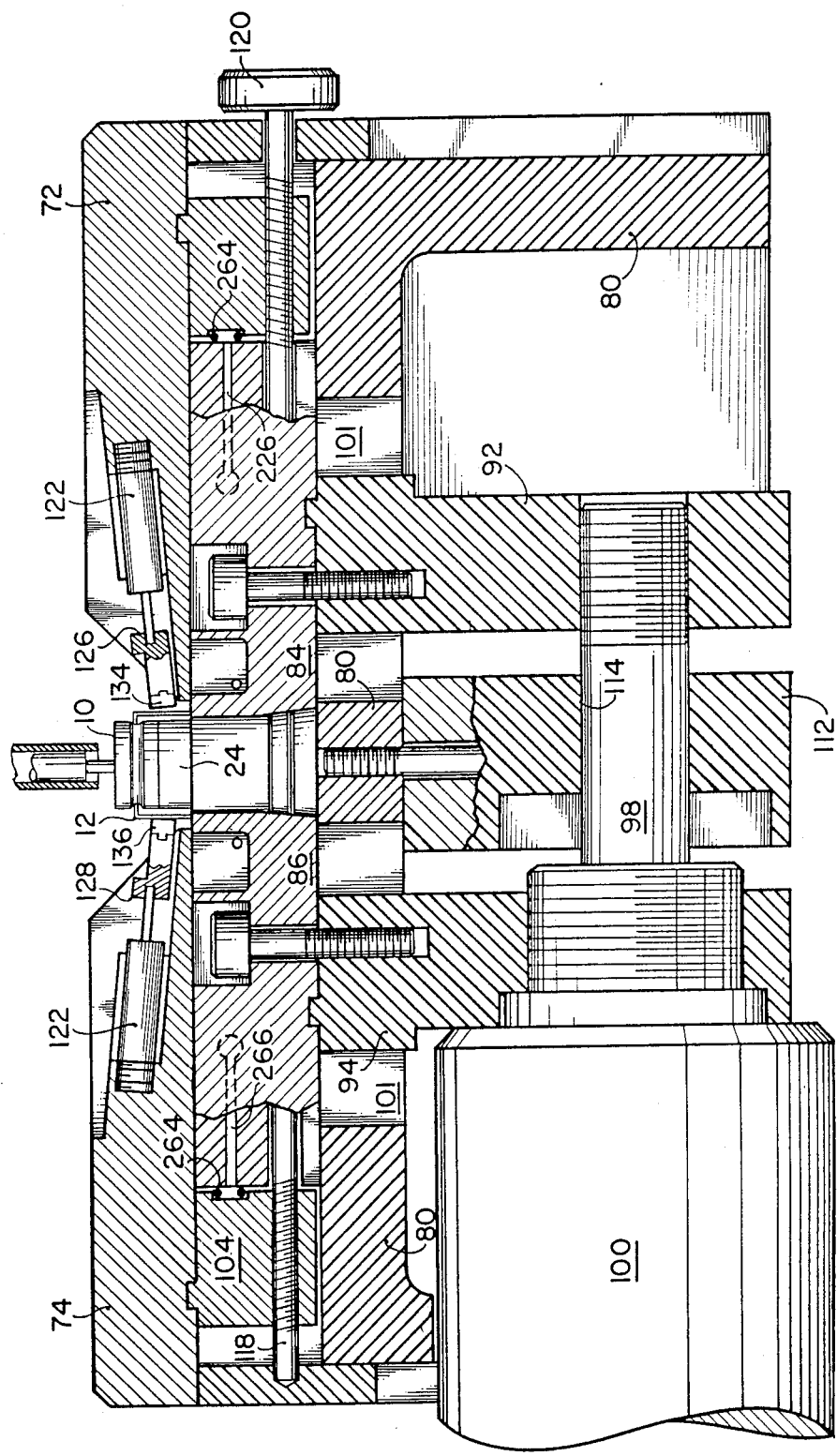
FIG. 6 is a section view along the line 6—6 of FIG. 4.

In the extended position, cutting blades 84 and 86 underlie the trimmed leads and to this end, stops 102 and 104 attached to shear plates 72 are adjustable to limit outward travel of cutting blades and determine the desired extended position (See FIG. 6). It was found that during trimming, the leads 12 tend to move slightly upwardly and away from the cutting and shearing edges, returning downwardly to their original position if the topface of the cutting blade had moved completely beneath the shear plate. This resulted in a slight length of lead 12 contacting the backfaces of the cutting blades as they are retracted toward track 24, bending or deforming the leads.

The retracted movement of the cutting blades towards track 24 is restricted by brackets 92 and 94 contacting center stop 112 as cylinder 100 retracts piston 98. Piston 98 slides axially through bore 114 in stop 112 which in turn is securely attached to a cross-portion of housing 80 beneath and in line with track 24. It is preferred to size stop 112 so that a slight gap is present between the backfaces when the cutting blades are in the retracted position. The slight gap prevents shavings, falling between the cutting blades during trimming, from affecting operation of the trimmer assembly.

Another feature of the trimmer assembly 46 of the present invention is the adjustability of the shear plates 72 and 74 relative to one another in a direction transverse to trackway 24 so that the distance between the confronting parallel straight edges 76 and 78 may be selectively varied for various types of DIP devices which may vary in width W. As indicated previously, in order to obtain accurate and precise trimming with minimum bowing or bending of the leads, it is desirable to position the edges 76 and 78 as close to the outer face of the leads as possible and yet space them sufficiently to maintain a small clearance allowing free movement of the DIP devices on the trackway as they are discharged from trimming station $S_T$. As shown in FIG. 7, screws 82 pass through non-threaded slots 116 in the shear plates to threadedly engage in housing 80. Loosening screws 82 allows sliding movement of the shear plates transverse to track 24. Rod 118 passing through and engaging oppositely pitched threaded bores in stops 102 and 104 causes the stops to move toward or away from each other as it is rotated. Turning knob 120, securely attached to one end of rod 118, thereby causes shear plates 72 and 74 to move toward or away from track 24. The movement of stops 102 and 104 simultaneously serves to adjust the slide limits of cutting blades 84 and 86 so that leads 12 are cut against edges 76 and 78 without any further adjustments.

The trimmer assembly 46 also includes means in the form of a snubber mechanism for firmly supporting the leads at the trimming station during the trimming operation which also functions to support the trimmed bridge 16 of the harness and prevent it from jamming the apparatus after it has been separated in the trimming operation. The snubber mechanism as best illustrated in FIG. 6 includes a pair of pneumatically actuated cylinder mechanisms 122 mounted on each of the shear plates 72 and 74, the pistons of each assembly mounting support brackets 126 and 128 having pads 134, 136 made of a resilient material such as rubber which are adapted to confront and engage leads 12 of the DIP device at the trimmer station in the manner shown in FIG. 11.

The entire trimmer assembly 46 is mounted for vertical adjustment relative to trackway 24 thereby to facilitate adjustment of the cutting plane relative to the top surface of the trackway and in this manner provide a relatively easy and quick means for adjusting the apparatus to cut the leads at varying predetermined selected lengths L. The vertical adjusting means best illustrated in FIG. 8 includes a pair of mounting blocks 138 and 140 secured to faceplate 36 on either side of housing 80. The pads are normally spring biased to a retracted position away from the DIP leads and firmly engage and support the DIP leads during the trimming operation by activation of the air cylinders 122.

The entire trimmer assembly 46 is mounted for vertical adjustment relative to trackway 24 thereby to facilitate adjustment of the cutting plane relative to the trackway and in this manner provide a relatively easy and quick means for adjusting the apparatus to cut the leads at varying predetermined selected lengths L. The vertical adjusting means best illustrated in FIG. 8 includes a pair of mounting blocks 138 and 140 secured to faceplate 36 on either side of housing 80. Brace plates 139 and 141 are securely attached to the mounting blocks, so that housing 80 is held captive therebetween and thus cannot move transversely relative to track 24, only vertically. Two arms 142 and 144 having angularly disposed cam slots 146 and 148 are slideably positioned in slots 150 and 152. Pins 154 are attached to housing 80 and positioned to cooperate with and engage cam slots 146 and 148 to move trimmer assembly 46 in a vertical direction relative to track 24 as the arms 142 and 144 slide in mounting blocks 138 and 140. Sliding movement of arms 142 and 144 is effectuated through knob 48. Knob 48 is securely attached to one end of a threaded shaft which in turn passes through support member 158 and engages a threaded bore in cross piece 160. Support member 158 is securely attached to faceplate 36 spaced from cross piece 160 which is securely attached between arms 142 and 144. Thus, turning knob 48 moves arms 142 and 144 simultaneously transversely to track 24 which causes pins 154, engaging angularly disposed cam slots 146 and 148, to move housing 80 and, therefore, trimmer assembly 46, vertically relative to track 24. An indicator 162 having indicia about its periphery related to lead lengths L for a given setting of the trimmer apparatus is mounted on faceplate 36 and has a pointer connected to a plunger 164 which contacts the trimmer assembly via a fine adjustment or calibration screw 166. In this manner, as the operator adjusts the vertical position of the trimmer assembly 46 by rotating hand wheel 48, the pointer sweeps the indicia on the dial indicator. For example, the sheel and dial may be calibrated in numbers corresponding to the DIP length L in millimeters. The dial is graduated in a predetermined manner so that the operator can observe direct readings and correlate it to DIP length L.

Consider now the singulator system for controlling movement of a continuous line of DIP devices propelled along track 24 by either passive gravity feed or by an active means. Referring to FIGS. 9 and 10, the singulator system performs three functions designed to continuously position one DIP device at a time at the trimming station. These functions are: (1) restrain and position the on-coming DIP (D1) at the trimming station; (2) restrain the next-in-line DIP (D2) separately from the remaining DIPs in the feed line; and (3) restrain the remaining DIPs (D3, D4, D5 . . . DN) in the feed line. These functions are achieved by the synchronized operation of pneumatically actuated, spring retracted mechanisms, acting on conjunction with sensors and control electronics. Referring again to FIGS. 9, 10 and 11, a detailed description of the singulator system and its operation to effect a continuous automatic feeding of single DIP devices to the trimming station follows. To facilitate understanding of the singulator system, the following description will consider only the operation of the pneumatically actuated mechanisms 200, 212, 216, 214, 198, 188, 122 and cutting blades 84 and 86 and light sensors 225 and 205. Later paragraphs will explain the detailed function, design, and operation of the associated control electronics. For purposes of illustrating the operation, one complete cycle is described in the following paragraphs. It should be recognized, however, that the system continuously and automatically feeds and trims DIP devices.

Referring to FIG. 10, consider the following conditions as an arbitrary starting point for one cycle operation.

(1) Arm 206 is depressed by pneumatically actuated rod 212a, stopping and positioning DIP D1 at trimming station $S_T$ and obstructing light path formed by photo emitter 205 and fibre optic light pipe 202.

(2) Pin 216 is pneumatically actuated extending downwardly to restrain DIP D1 at the trimming station.

(3) Pin 188 is pneumatically actuated extending upward through track 24 preventing DIP D2 from progressing to trimming station.

(4) Pin 198 is pneumatically actuated extending downwardly onto DIP D3 preventing the remaining DIPs from progressing along track 24.

The DIP positioning and restraining operation is triggered by DIP D0 passing through and interrupting the light path formed by photo emitter 225 and fibre optic light pipe 220 and results in the arbitrary starting point described above. The lead trimming operation is triggered by DIP D1 as it obstructs the light path formed by photo emitter 205 and fibre optics light pipe 202. The DIP releasing operation is triggered by the retraction of the lead trimmers after it has cut the DIP leads. Considering first the lead trimming operation as shown in FIGS. 11A, 11B and 11C two actions are initiated by D1 obstructing the light path of photo emitter 205: (1) clamping mechanisms 126 and 128 are pneumatically actuated and support DIP D1 leads during the cutting cycle; and (2) cutting blades (84 and 86) are pneumatically actuated trimming the leads to the desired length. As FIG. 11 illustrates, the lead trimmers are operated by a single dual action pneumatic actuator. When fully retracted, the trimmer control circuit signals the DIP releasing operation. This results in the sequential retraction of clamping mechanisms 126 and 128, pin 216, rod 212a, and arm 206. DIP D1 is now free to continue its progress along track 24. As it interrupts light path formed by 225 and 220, rod 212a, depresses arm 206, and retracts pins 188 allowing DIP D2 to progress to the trimming station vacated by DIP D1. As light path formed by 205 and 202 is obstructed, pin 188 is again extended while pin 198 is retracted allowing D3 to replace D2 and D4 to replace D3, etc. Simultaneously with these actions, as previously explained, the lead trimming operation is initiated, completing one operating cycle.

Consider now the specific details and arrangement of the singulating system $S_S$ and more specifically the detent and DIP retaining mechanisms for which control movement of DIP devices on the trackway so that only one DIP device at a time is trimmed at the trimming station. A series of stop pins 184, 186 and 188, in the present instance three stop pins, are longitudinally spaced along trackway 24 operable selectively between an extended position projecting through the trackway (See FIG. 9) in the path of DIP devices and operable to restrain the same and a lowered position (See FIG. 10) to release and permit movement of DIP devices along the trackway. The stop pins are part of pneumatically actuated cylinder mechanisms 190, 192 and 194 normally biased to a retracted position and upon air actuation of the cylinder are moved to an extended position. A clamping pin 198a is mounted in the guide rail 28 upstream of the series of stop pins and likewise is a part of a pneumatically actuated cylinder mechanism 198 which is normally spring biased to a retracted position and is operable upon air actuation of its associated cylinder to an extended position to engage the body portion of a DIP device and hold it in place on the trackway in the manner shown in FIG. 10. The stop pins 184, 186 and 188 and clamping pin 198a are slaved and operate together so that when a selected one of the stop pins is in a retracted position, the clamping pin is in an extended position. The stop pins and clamping pins function in the following manner. At the start of operation, a selected one of the stop pins is in an extended position so that the lead DIP device encountering singulating system $S_S$ abuts stop pin 184 in the manner shown in FIG. 10. The next adjacent rearward DIP device abuts the first DIP device and is located so that a portion thereof underlies the clamping pin 198a. Stop pin 184 is now retracted so that the first DIP device is free to move into the trimming station, clamping pin 198a simultaneously moving to an extended position to restrain the next DIP device and subsequent DIP devices aligned therewith in the cartridge. In order to achieve the singulating action described for DIP devices of varying overall length $L_D$, three stop pins longitudinally spaced along the trackway. For example, the distance between a given stop pin and the clamping pin is always less than twice the overall length $L_D$ of the DIP devices being processed to ensure the singulating action described above.

Another feature of the singulating system comprises the rearwardly inclined ramp portion 24a adjacent the clamping pin location and an ejector mechanism 200 in the form of an angularly disposed pin which is normally spring biased to a retracted position and has an air actuated cylinder to cycle it to an extended upward position. It has been found that occasionally the adjacent DIP devices tend to catch or nest at their abutting ends specifically, the inverted U-shaped bridges 16 of DIP devices having a harness. In accordance with the feature described above, the forward most DIP device as it passes over the ramp tends to drop slightly into the recessed ramp section 24a of the trackway causing a separating action relative to the next abutting DIP in line. Additionally, the cycling of the ejector pin 199 of cylinder 200, which is timed with the release of one of the stop pins 184, 186 or 188 ensures freeing of a DIP device and free passage to the trimming station.

Figure 15:
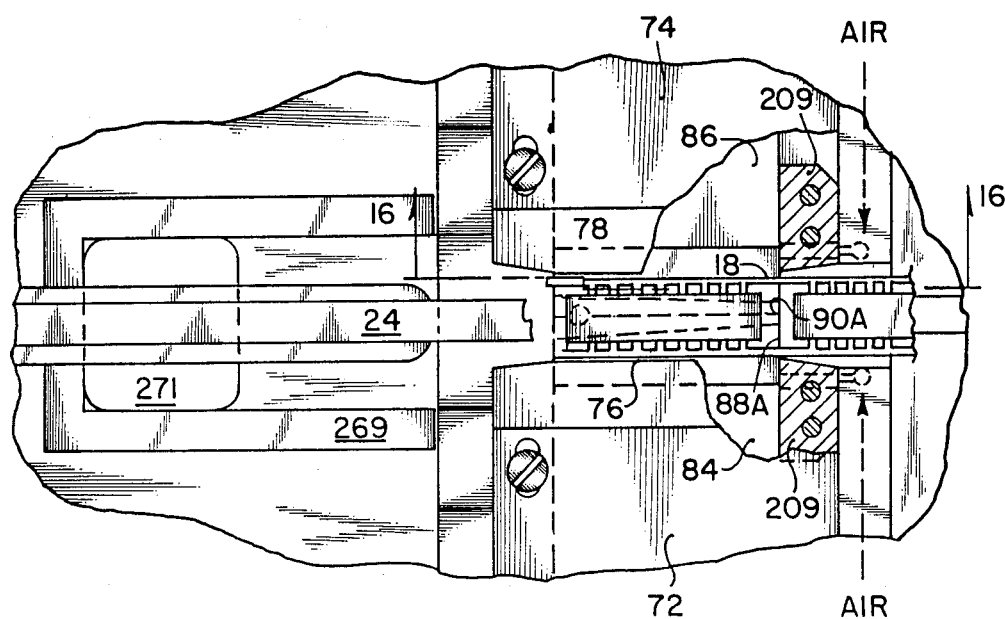
FIG. 15 is a partial and broken view of the trimmer assembly wherein DIP devices of the type shown in FIG. 10 are positioned therein.
Figure 16:
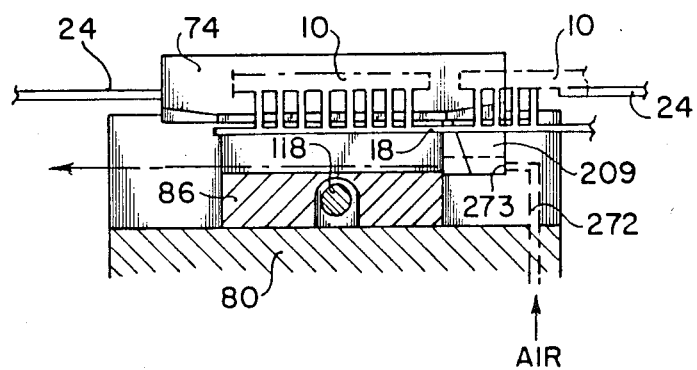
FIG. 16 is a section view along the line 16—16 of FIG. 15.
Figure 17:
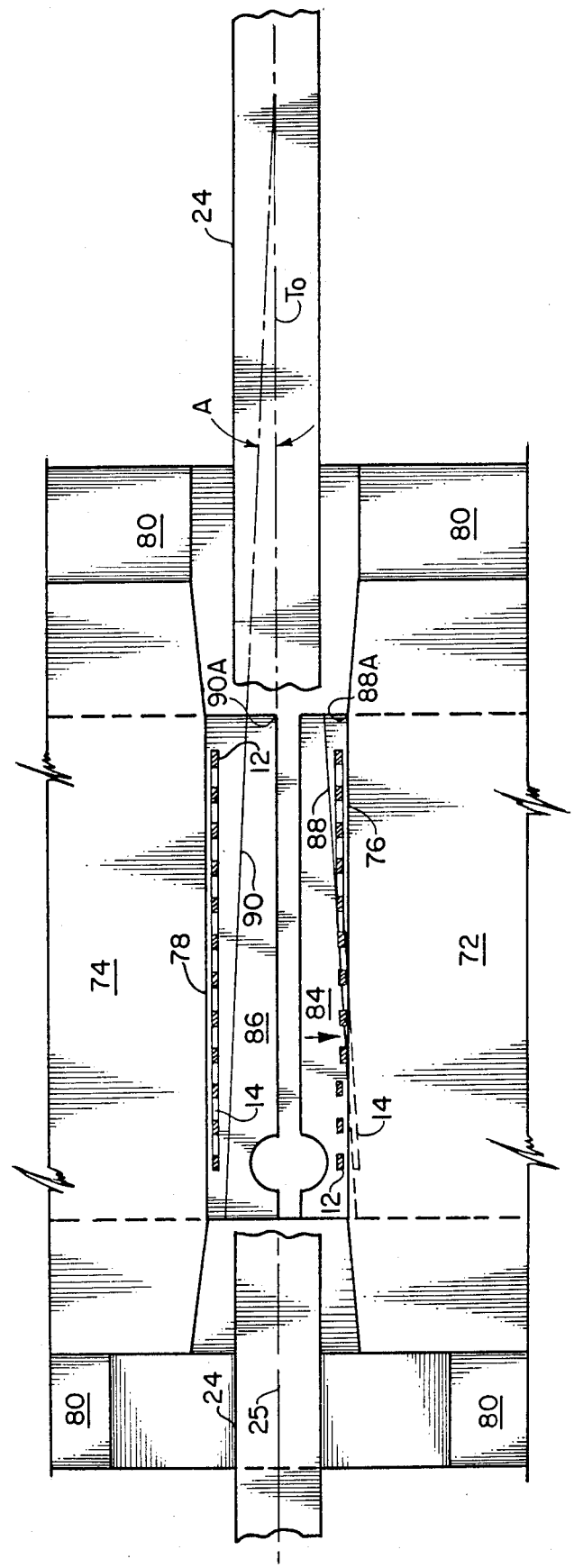
FIG. 17 is a partial plan view of the trimmer assembly, wherein one of the cutting blades has begun to extend, engaging the leads and cutting them against a shear plate.

A special case also occurs in the trimming station $S_T$ if DIP devices having connecting strips 18 (FIG. 1D) are to be trimmed thereon. In such situations it is necessary to make a vertical cut of strip 18 as well as trimming leads 12. To this end a second shear plate 209 is attached to the underside of each shear plate 72 and 74, as shown in FIGS. 15 and 16. As the cutting blades extend cutting leads 12 against the shear plates 72 and 74, the vertical edges 88A and 90A cuttingly engage strips 18 and trim them against shear plates 209.

When DIP devices which include bridges 16 are being trimmed, it is necessary to remove loose bridges from track 24 after the trimming operation to prevent jamming or other blocking of the track. To this end a gap 228 is provided in track 24 which is wide enough for the removal of the bridges yet sufficiently narrow such that DIP devices will not fall therein. Additionally, a blast of air is directed from orifice 227 in guiderail 28 onto track 24 to force bridges 16 into gap 228. When DIP devices not inlcuding bridges 16 are trimmed, movable track portion 226 is adjusted to cover gap 228.

Having described the structure of trimming device 20 and the individual operation of various stations exposed along track 24, consider now a complete automatic trimming cycle. As shown in FIG. 9, a DIP device passing from loading station $S_L$ on track 24 is obstructed by the extension of stop pin 188 into the path of the DIP device. (See FIG. 9) A portion of a second DIP device extends beneath pin 198a and abuts the first DIP device. Pin 198a is retracted at this point of the cycle. To release a single DIP device, the singulator system $S_S$ extends pin 198a holding the second DIP device in place and stop pin 188 is retracted releasing the first DIP device to continue travel on track 24. As was previously explained, arm 206 is moved onto track 24 in the path of DIP devices traveling thereon, simultaneous will the extension of pin 198a. Accordingly, the DIP released by stop pin 188 travels on track 24 until it contacts arm 206. As is shown in FIG. 10, contact with arm 206 trips sensor 205 which signals the control system that a DIP device is located in trimming station $S_T$. FIG. 11A shows the position of the components of the trimming assembly 46 prior to DIP device contacting arm 206 i.e. cutting blades 84 and 86 are in their retracted positions with the cutting portion disposed beneath track 24. Cylinders 122 and pins 214 and 216 are also in the retracted position. Once sensor 205 signals the control system that a DIP device is present in the trimming station $S_T$, the control system extends piston 98 of cylinder 100. As shown in FIG. 11B, piston 98 has begun its extension, moving cutting blade 84 outwardly from under track 24 engaging and cutting leads 12 against shear plate 72. Simultaneous with the actuation of cylinder 100 is the extension of cylinders 122 and pins 214 and 216, supporting and holding the DIP device during the trimming operation. As previously indicated, the distance between the top surface of track 24 and the cutting plane have been preset to provide a predetermined lead length L upon completion of the trimming operation. As shown in FIG. 11C, cutting blade 86 has also moved outwardly by the completion of the extension of piston 98. A trimming operation has now been completed.

The control system next retracts cylinder 212 allowing arm 206 to return to its biased position, releasing the DIP device contained in the trimming station $S_T$. Retraction of cylinder 212 occurs simultaneously with the retraction of pin 198a and extension of stop pin 188. Thus, the second DIP device, previously held by pin 198a, now abuts stop pin 188 in preparation for its travel to the trimming station $S_T$. The DIP device passing out of trimming station $S_T$ interrupts the light received by sensor 221 signalling the control system to release the DIP device then abutting stop pin 188. This operation will continue until all of the devices contained in loading station $S_L$ have been trimmed or until the control system determines that the packaging tubes contained in the discharge station $S_D$ are full, which will be described in greater detail hereinafter.

Figure 13:
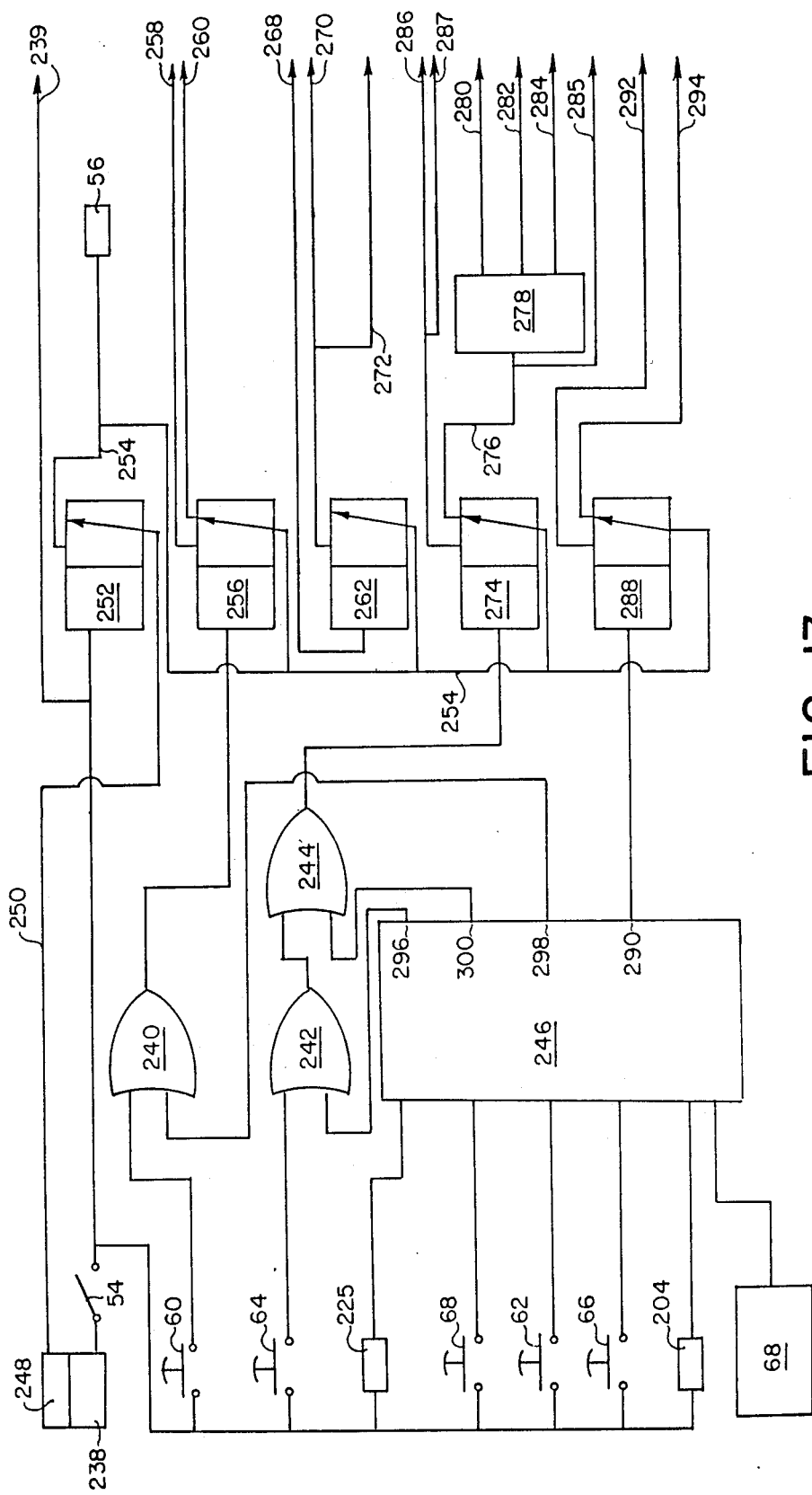
FIG. 13 is a diagramatic view of the control and operating system of the present invention.
Figure 14A:
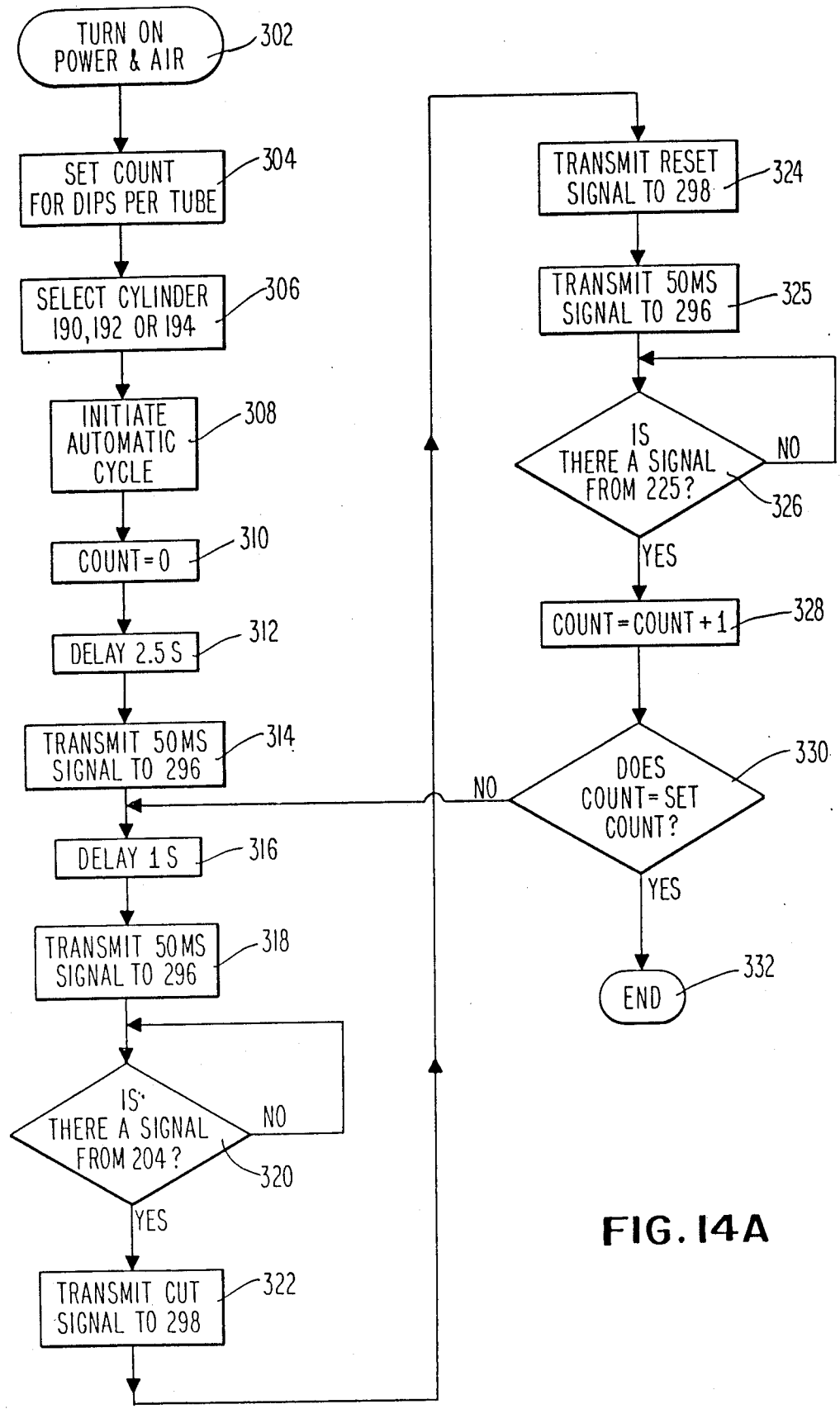
FIGS. 14A and 14B are a flow chart depicting the automatic cycle operation of the instant invention as controlled by the electonic controller and a flow chart of the manual operation of the instant invention.
Figure 14B:
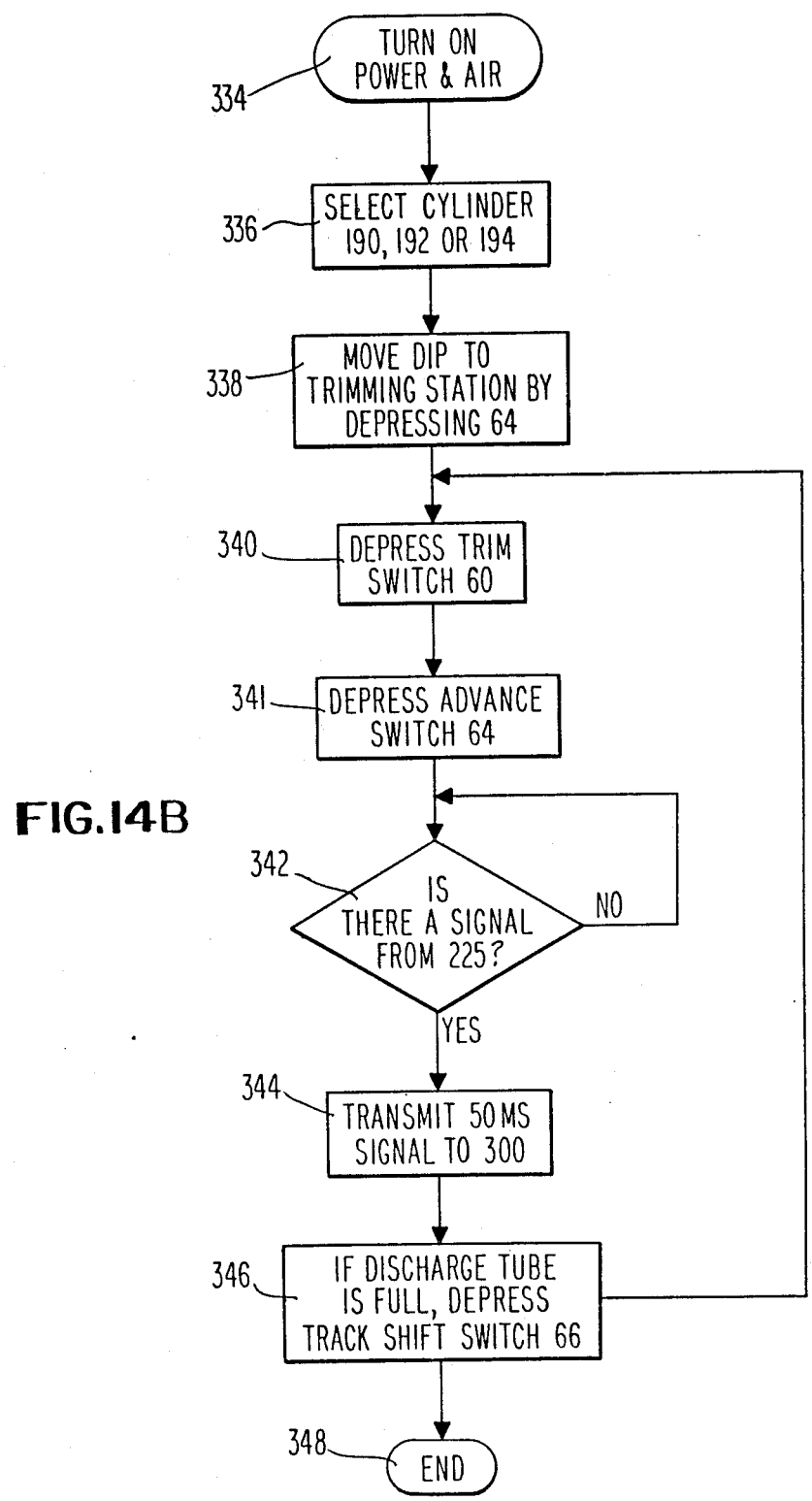

Referring now to FIGS. 13 and 14, the control system of trimmer apparatus 20, which generally is an electronically controlled air actuated system, will be described in greater detail. Consider first the interconnection of the electronic components of the control system. Power switch 54 when closed applies power from a source of electrical energy 238 to the control system including power to light sources 204 and 224 on line 239. Trim switch 60 is electrically connected between power switch 54 and one input of OR gate 240. Advance switch 64 is electrically connected between power switch 54 and one input of OR gate 242. Photosensor 225 is connected to power switch 54 and one input of OR gate 244 such that when the reception of light from source 204 (shown in FIG. 9) is interrupted by a DIP device, a signal is transmitted to OR gate 244. The other input of OR gate 244 is electrically connected to the output of OR gate 242. Auto cycle switch 58 is electrically connected between power switch 54 and electronic controller 246. Electronic controller 246 may be either microprocessor based or comprise digital logic circuitry. Rather than describe particular circuitry, FIG. 14 discloses flow charts detailing the operation of the circuitry. Those skilled in the art will readily appreciate from these charts the types and arrangement of electronic components to be included in this controller. Automatic cycle switch 58 serves to initiate the automatic operation of the trimmer. Stop switch 62 is electrically connected between power switch 54 and controller 246 and serves to signal controller 246 to stop the automatic cycling of the trimmer. Track shift switch 66 is also electrically connected between power switch 54 and controller 246 and serves to provide a signal to controller 246 which manually shifts track 52 in discharge station 50. Photosensor 204 is electrically connected between power switch 54 and controller 246 such that if the reception of light from source 224 (shown in FIG. 9) is interrupted by a DIP device, a signal is transmitted to controller 246 indicating that the DIP has moved out of the trimming station $S_T$.

Set switch 68 is connected to controller 246 and serves to indicate the number of DIP devices which will be discharged into a single tube or cartridge contained in discharge track 52. In the preferred embodiment, set switch 68 is a thumb wheel type device.

Consider now the connection of the air supply portion of the control system to various air actuated cylinders in the trimmer apparatus 20, and the interconnection of the air supply portion to several of the electronic components of the control system. Air source 248 provides air under pressure through line 250 to main air valve 252, the output of which provides air to all the other air valves in the control system through line 254. Line 254 also connects to indicator 56 such that when power switch 54 is closed valve 252 switches to the opposite position than is shown in FIG. 13 and indicator 56 is actuated. Valve 252, similar to all the air valves in the system, is an electrically operable, i.e. solenoid actuated, air valve.

Air valve 256 is electrically connected to the output of OR gate 240 and is switched thereby. The outputs of valve 256 are connected through lines 258, and 260 to either side of piston 98 in double acting air cylinder 100. Air through line 258 extends piston 98, which performs the cutting operation previously described, and air applied through line 260 retracts piston 98, which returns the cutting blades to position shown in FIG. 11A.

Air valve 262 is connected by line 268 to bore 266, shown in FIG. 6, and supplies air therethrough. As cutting blades 84 and 86 move toward stops 102 and 104 contacting O-ring 264 a back pressure condition occurs from air supplied by line 268. This back pressure condition serves to switch valve 262 from the position shown to provide air through lines 270 and 272. The ends of line 270 and 272 are attached to bore 273 which open at one end of slots 91 to discharge air after the cutting operation has occurred to assure the removal of shavings or trimmings from the cavities. (See FIGS. 8 and 11B) As shown in FIG. 4, shavings or trimmings blown out of slots 91 strike back stop member 269 and fall through cavity 271 into a suitable collector in the trimmer apparatus housing 39.

Air valve 274 is electrically connected to the output of OR gate 244 which serves to switch the valve. In the position shown in FIG. 13, valve 274 applies air to line 276 which is connected to selector 278. Selector 278 will apply air to any one of its outputs 280, 282 or 284, whichever is selected. Lines 280, 282, and 284 are connected to cylinders 190, 192 and 194, respectively, shown in FIG. 9 which upon movement of stop pins 184, 186 or 188 serve to halt the progression of DIP devices on track 24. Line 276 also applies air to line 285 which supplies air to orifice 227 in guide rail 28, assisting in the removal of bridges 16. The other output of valve 274 supplies air through line 286 to cylinder 198, the pin of which as shown in FIG. 10, serves to hold the DIP devices on track 24 when its piston is extended. Valve 274 also passes air through line 287 to cylinder 212 which by extension of its piston causes arm 206 to pivot onto track 24, also shown in FIG. 10. Thus, as valve 274 alternates between outputs, either pin 198a and arm 206 will be moved onto track 24 engaging DIPs traveling thereon or a cylinder selected by selector 278 will extend a stop pin through track 24, controlling the flow of DIP devices.

Air valve 288 is electrically connected to output 290 of controller 246 and is switched thereby. Valve 288 applies air to either end of a double acting cylinder (not shown) through lines 292 and 294 which serves to move switch track 52 is discharge station $S_D$ shown in FIG. 4 to present alternative packaging tubes for the DIP devices.

Referring now to FIG. 14, the operation of electronic controller 246 will be discussed in greater detail. Consider first the automatic operation of trimmer apparatus 20. Initially, in step 302 the power and air are turned on, the number of DIP's per tube is entered into controller 246 in step 304 at set member 68, and in step 306 one of the cylinders 190, 192 or 194 is selected at selector 278. As previously described, the selection of cylinder 190, 192 or 194 and hence stop pin 184, 186 or 188 is dependent upon the length of the DIP device. By positioning one complete DIP device and a portion of a second DIP device between the selected stop pin and the piston of cylinder 198, the singulator system $S_S$ is assured of only allowing one DIP device at a time to pass to trimming station $S_T$. The system is now ready to be initialized, which occurs in step 308 by depressing automatic cycle switch 58. Controller 246 first sets an internal counter to zero with command 310. After the 2.5 second delay of step 312, a 50 milli-second signal is applied to output 296 in step 314. Since all of the inputs to OR gates 240, 242 and 244 are normally low or at zero volts, a signal applied to output 296 causes a following or similar signal to be output from OR gate 242 and also OR gate 244. The output of the signal from OR gate 244 switches valve 274, deactivating the selected cylinder 190, 192 or 194 retracting the stop pins associated therewith from track 24 and actuating cylinders 198 and 212 moving arm 206 and the piston or cylinder 198 onto track 24. This permits the DIP device stopped by the selected stop pin to continue along track 24 to arm 206, while the remaining DIP devices are held in place by the piston of cylinder 198 shown in FIG. 10. At step 320, controller 246 is awaiting a signal from sensor 204 indicating that the DIP device is in trimming station $S_T$ having been halted by arm 206. Once sensor 204 indicates that a DIP device is present (see FIG. 10), controller 246 transmits a cut signal from output 298 which causes OR gate 240 to output a signal switching valve 256 from that position shown in FIG. 13 to a position which actuates the extension of piston 98 moving the cutting blades as shown in FIGS. 11B and 11C. Controller 246, in step 324, transmits a reset signal from output 298 which causes OR gates 240 to output a further signal switching valve 256 to return to the position shown in FIG. 13 retracting piston 98 returning the cutting blades to the position shown in FIG. 11A and allowing the pistons of cylinders 212, 214 and 216 to return to their biased position shown in FIG. 9. Controller 246 at step 325, transmits a 50 milli-second signal from output 296 which, as previously described, switches valve 274 back to the position shown in FIG. 13 which allows the pistons of cylinders 198 and 212 to return to their biased position releasing the DIP devices held thereby and also actuating the selected cylinder and allowing the DIP devices to pass to the stop pin associated with the selected cylinder shown in FIG. 9.

Controller 246 at step 326 awaits a signal from sensor 225 indicating that the DIP device has passed out of trimming station $S_T$ towards discharge station $S_D$. At step 328, controller 246 increments its count of the DIP devices by one and determines in step 330 whether this count is equal to the count preset by input 68. If the count has not yet equalled the preset count, the controller returns to step 316 and runs through the process again. If the count has reached the preset count, controller 246 can apply a signal to output 290 activating valve 288 which in turn moves the switch track 52 presenting an empty packaging tube to track 24, or the controller can stop at step 332, as shown in FIG. 14A.

Considering now the manual operation of trimmer apparatus 20, at step 334 the power and air are turned on, which can be accomplished by manually closing switch 54. A cylinder 190, 192 or 194 is selected at step 336, the selection as previously described being dependent upon the length of the DIP device. At step 338 a DIP device is moved to trimming station 44 by manually closing switch 64. Closing switch 64 causes an output signal from OR gate 242 and consequently from OR gate 244 which switches valve 274 to a position opposite that shown in FIG. 13 de-actuating the selected cylinder lowering the selected stop pin and actuating cylinders 198 which the piston of which when extended holds DIP devices in the loading station $S_L$ (FIG. 10), and cylinder 212 which lowers arm 206 onto track 24, respectively. Arm 206 halts the movement of the DIP device released by the lowering of the selected stop pin from track 24. The DIP device is trimmed at step 340 whereat switch 60 is manually closed providing a signal to an input of OR gate 240. The output of OR gate 240 actuates valve 256 which switches to provide air to line 258 which extends piston 98 of cylinder 100. Opening or releasing switch 60 causes the output of OR gate 240 to again return to zero volts which switches valve 256 back to the position shown in FIG. 13, retracting piston 98. Advance switch 64 is closed in step 341 which switches valve 274 back to the position shown in FIG. 13, de-actuating cylinder 212, which in turn returns arm 206 to its biased position allowing the DIP device to travel to the discharge station. At step 342 controller 246 will receive a signal from sensor 225 that the DIP device is passing therebeneath and provides a 50 milli-second signal to output 300 which causes an output at OR gate 244 switching valve 274 which as previously described advances another DIP device to trimming station $S_T$. If the discharge tube is not full, manual operation can be continued by returning to step 340 and closing switch 60.

What is claimed is:

1. A method for trimming leads of electronic devices having a body portion and a plurality of leads extending from the body portion in rows on opposite sides thereof consisting of the steps of passing devices through a channel defined by confronting edges of a pair of spaced shear plates, holding a device with the rows confronting and adjacent the shear plates, applying a lead trimming force to shear leads to the inner confronting faces thereof to effect a cutting action from inboard of the channel outwardly toward the edges of the shear plates.

2. A method for trimming leads of electronic devices having a body portion and a plurality of leads extending from the body portion in rows on opposite sides thereof comprising the steps of:

placing said devices on a device support for travel through a plurality of stations disposed along said support;

singularizing said devices such that only one device at a time travels to stations disposed downstream along said support;

stopping said device in a trimming station between spaced edges of shear plates defining a channel therebetween;

forcibly restraining the top of said body portion and outer lead sides at the trimming station;

applying a lead trimming force to shear leads to the inner confronting faces thereof to effect a cutting action from inboard of the channel outwardly toward the edges of the shear plates; and releasing said device from said trimming station so that said device may continue its travel along said support.

3. A method as claimed in claim 1 including the step of engaging the leads on opposite sides by a snubbing mechanism having resilient members engaging the opposing leads during the trimming operation.

4. A method as claimed in claim 1 wherein the leads are sheared sequentially.

5. A method as claimed in claim 4 wherein the sequential cutting is produced by beveled cutting blades.

* * * * *